United States Patent
Tanaka

(10) Patent No.: US 6,807,403 B2
(45) Date of Patent: Oct. 19, 2004

(54) RADIO TELEPHONE APPARATUS

(75) Inventor: Mitsuru Tanaka, Saitama (JP)

(73) Assignee: NEC Corporation, Tokyo (JP)

( * ) Notice: Subject to any disclaimer, the term of this patent is extended or adjusted under 35 U.S.C. 154(b) by 371 days.

(21) Appl. No.: 09/866,734

(22) Filed: May 30, 2001

(65) Prior Publication Data
US 2001/0023177 A1 Sep. 20, 2001

Related U.S. Application Data

(62) Division of application No. 09/281,472, filed on Mar. 30, 1999.

(30) Foreign Application Priority Data

Apr. 3, 1998 (JP) .......................................... 10-091521

(51) Int. Cl.$^7$ ................................................. H04B 1/04
(52) U.S. Cl. ................. 455/126; 455/127.1; 455/127.2; 455/127.5
(58) Field of Search .............................. 455/126, 127.1, 455/127.2, 127.3, 127.4, 127.5, 129, 522, 574, 115.1, 125; 330/291, 296, 290, 134

(56) References Cited

U.S. PATENT DOCUMENTS

| 4,392,245 | A | * | 7/1983 | Mitama | ................... | 455/115.1 |
|---|---|---|---|---|---|---|
| 4,709,403 | A | | 11/1987 | Kikuchi | | |
| 5,126,686 | A | * | 6/1992 | Tam | ........................... | 330/134 |
| 5,438,683 | A | | 8/1995 | Durtler et al. | | |
| 5,510,859 | A | | 4/1996 | Douglass et al. | | |
| 5,585,762 | A | * | 12/1996 | Dekker | ....................... | 330/144 |
| 5,598,126 | A | * | 1/1997 | Dekker | ....................... | 330/129 |
| 5,752,171 | A | * | 5/1998 | Akiya | ......................... | 455/126 |
| 5,974,040 | A | | 10/1999 | Kimura | | |
| 6,052,033 | A | * | 4/2000 | Schneider | .................... | 330/302 |
| 6,301,486 | B1 | * | 10/2001 | Tanaka | ....................... | 455/522 |

* cited by examiner

Primary Examiner—Sonny Trinh
(74) Attorney, Agent, or Firm—McGinn & Gibb, PLLC

(57) ABSTRACT

A voltage control variable attenuator takes a structure using a feedback loop which allows a signal modulated by a modulator to be attenuated based on a comparison result from a comparator. A power amplifier outputs the signal inputted thereto from the voltage control variable attenuator without amplifying the signal when no control signal is outputted from a control section, and amplifies a power of the signal inputted thereto from the voltage control variable attenuator to output it when the control signal is outputted from the control section. In a detection circuit, a change-over switch is provided which switches a detection voltage to be detected, depending on whether or not the control signal is outputted from the control section.

10 Claims, 4 Drawing Sheets

RADIO TELEPHONE APPARATUS

This is a division of application Ser. No. 09/281,472, filed Mar. 30, 1999.

BACKGROUND OF THE INVENTION

1. Field of the Invention

The present invention relates to a radio telephone apparatus which performs radio communications, more particularly to a power-saving control of a transmitted output in the radio telephone apparatus.

2. Description of the Related Art

A power-saving control of a transmitted output typified by a PHS radio telephone apparatus has been heretofore performed by limiting a dynamic range of a detection circuit provided therein. However, the method to limit the dynamic range of the detection circuit has been able to lower the transmitted power by 15 to 20 dB at most.

Accordingly, when a power-saving control exceeding 20 dB is required, a method has been employed, in which a fixed bias voltage is applied to a voltage control variable attenuator constituted by a pin diode and the like provided in a RF stage of a transmission system, and the power source of a driver amplifier is cut off, whereby a gain of the transmission system is lowered and the transmitted output is set to a predetermined power-saving output.

However, in the foregoing power-saving control method in the conventional radio telephone apparatus, during the power-saving control, an auto power control circuit (hereinafter, referred to as an APC circuit) in which a feedback loop is formed is in an OFF state, so that there is a problem that a variation in a gain of amplifier in the transmission system owing to an ambient temperature change directly becomes a variation in the transmitted output, and a stable transmitted output cannot be acquired.

Moreover, when a temperature compensation for the foregoing transmitted output is conducted, there is a problem that a circuit structure becomes complicated.

SUMMARY OF THE INVENTION

The present invention was made in consideration for the problems involved in the foregoing conventional arts, and the object of the present invention is to provide a radio telephone apparatus which is capable of obtaining a more stable transmitted output.

In order to achieve the above described object, a radio telephone apparatus of the present invention comprising:

an antenna for receiving and transmitting a radio wave;

receiving means for extracting a specified signal from the received radio wave through the antenna;

transmitting means for transmitting information to be transmitted to the outside through the foregoing antenna; and control means for outputting a control signal for lowering the transmitted output of the transmitting means by a specified amount, thereby controlling the transmitted output of the transmitting means, wherein the foregoing transmitting means comprises:

modulation means for modulating the signal to be transmitted through the foregoing antenna;

variable attenuating means for attenuating the signal modulated by the modulation means based on the control voltage inputted and outputting the attenuated signal;

amplifying means for directly outputting the signal inputted from the variable attenuating means when the control signal is outputted from the control means, and amplifying the signal outputted from the variable attenuating means to output the amplified signal when no control signal is outputted from the control means;

detection means for demodulating the signal inputted from the amplifying means, and detecting a detection voltage by different circuits depending on whether or not the control signal is outputted from said control means, based on an output of the control signal from the control means;

reference voltage generating means for generating different reference voltages depending on whether or not the control signal is outputted from said control means, based on an output of the control signal from the control means; and comparing means for comparing the reference voltage with the detection voltage detected by the detection means, thereby a comparison result, and wherein the variable attenuating means attenuates the signal modulated by the modulation means, using the control voltage based on the comparison result from the comparing means.

The radio telephone apparatus of the present invention is characterized in that a counter is provided, which performs a counting operation based on the comparison result outputted from the comparing means and outputting a counted value, a D/A converter is provided, which converts the counted value outputted from the counter to an analog signal, and the variable attenuating means attenuates the signal modulated by the modulation means, using the analog signal outputted from the D/A converter as the control voltage.

The radio telephone apparatus of the present invention is characterized in that the detection means includes two resistors having different resistivities from each other, and switches the detection voltage to be inputted to the comparing means by selectively coupling the comparing means with one of the two resistors based on the output of the control signal from the control means.

The radio telephone apparatus of the present invention is characterized in that the detection means has two directional couplers exhibiting different degrees of coupling, and switches the detection voltage to be inputted to the comparing means by selectively coupling the comparing means with one of the two directional couplers, based on the output of the control signal from the control means.

In the radio telephone apparatus of the present invention constructed as described above, the signal to be transmitted through the antenna is modulated by the modulation means provided in the control means, the signal modulated by the modulation means is attenuated by the variable attenuating means based on the control voltage inputted thereto, the signal attenuated by the variable attenuating means is amplified for its power by the amplifying means and outputted therefrom, the signal outputted from the amplifying means is demodulated by the detection means and the detection voltage is detected by the detection means, the detection voltage detected by the detection means is compared with a previously determined reference voltage by the comparing means, and the signal modulated by the modulation means is attenuated by the variable attenuating means based on the comparison result by the comparing means. Hereupon, the signal outputted from the variable attenuating means is directly outputted from the amplifying means when the control signal is outputted from the control means, and the signal outputted from the variable attenuating means is amplified for its power by the amplifying means and outputted therefrom when the control signal is not outputted from the control means. Furthermore, the detection means is constructed such that the detection voltage to be detected differs depending on the presence of outputting of the control signal from the control means.

As described above, the detection voltage is switched depending on the presence of outputting of the control signal from the control means and a feedback loop for controlling a transmitted power based on the comparison result of the detection voltage with the reference voltage is provided, so that a constant transmitted output can be achieved stably both at the times of a rated output and the power-saving control.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE PREFERRED EMBODIMENTS

Embodiments of the present invention will be described with reference to the accompanying drawings below.

Figure 1:
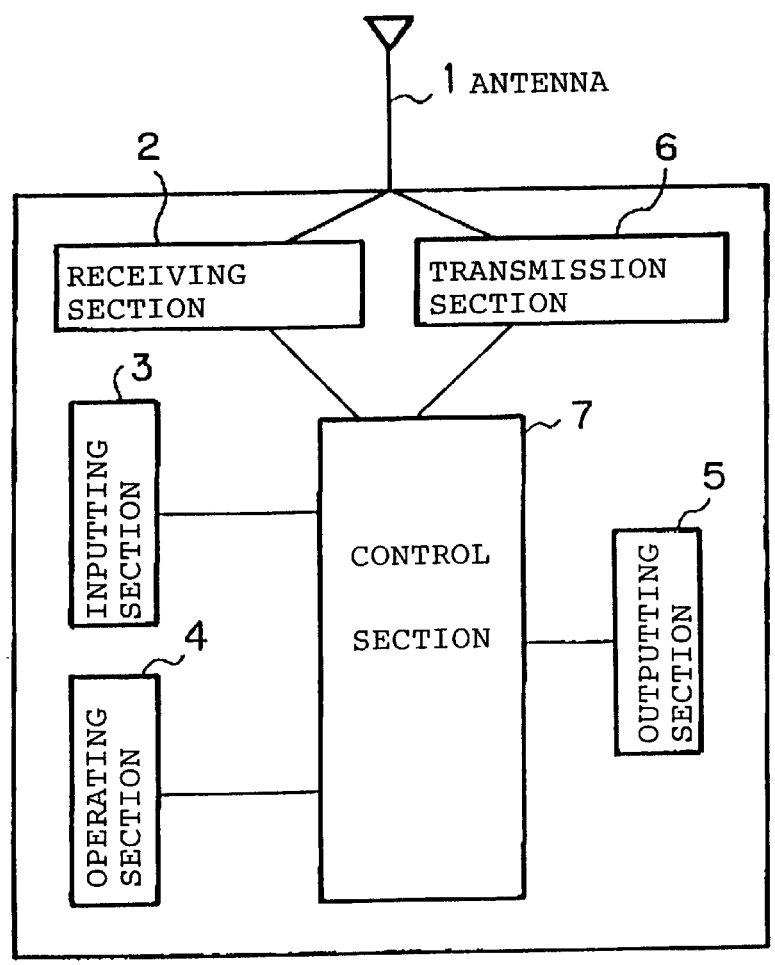
FIG. 1 is a block diagram showing an embodiment of a radio telephone apparatus of the present invention.
Figure 2:
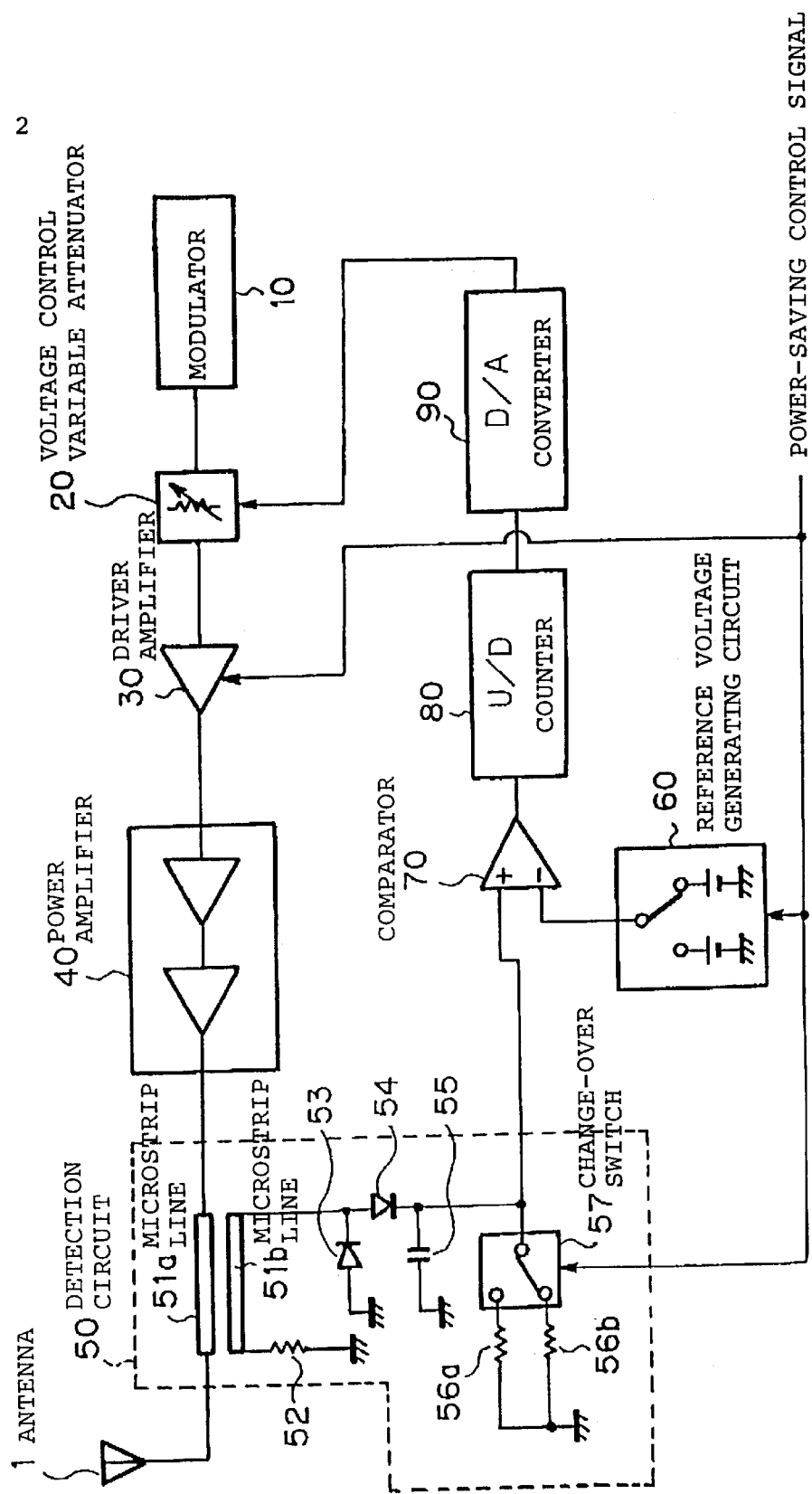
FIG. 2 is a block diagram showing a constitution example of a transmission section shown in FIG. 1.

FIG. 1 is a block diagram showing an embodiment of a radio telephone apparatus of the present invention, and FIG. 2 is a block diagram showing a constitution example of a transmission section shown in FIG. 1.

As shown in FIG. 1, the radio telephone apparatus of this embodiment comprises: antenna 1 for receiving and transmitting a radio wave; receiving section 2 for extracting a predetermined signal from the radio wave received through antenna 1; inputting section 3 to which voice information from the outside is inputted; operating section 4 to which information other than a voice from the outside is inputted; outputting section 5 for outputting the signal extracted by receiving section 2; transmission section 6 for transmitting information to be transmitted to the outside through antenna 1; and control section 7 for outputting the information inputted through inputting section 3 and operating section 4 and outputting a power-saving control signal to lower a transmitted output by a predetermined amount to transmission section 6.

Moreover, as shown in FIG. 2, transmission section 6 in this embodiment comprises: modulator 10 for modulating a signal to be transmitted through antenna 1; voltage control variable attenuator 20 for attenuating the signal modulated by modulator 10 based on the control voltage to output the attenuated signal; power amplifier 40 for amplifying a power of the signal outputted from the voltage control variable attenuator 20 and outputting the amplified signal; driver amplifier 30 for generating a signal to drive power amplifier 40 from the signal outputted from voltage control variable attenuator 20; detection circuit 50 for demodulating the signal outputted from power amplifier 40 and detecting a detection voltage; reference voltage generating circuit 60 for generating a previously determined reference voltage and outputting the reference voltage; comparator 70 for comparing the detection voltage detected by detection circuit 50 with the reference voltage outputted from reference voltage generating circuit 60 and outputting a comparison result; up-down counter 80 for performing a counting operation based on the comparison result outputted from comparator 70 and outputting a counted value; and D/A converter 90 for converting the counted value outputted from up-down counter 80 to an analog signal and outputting the analog signal. The analog signal outputted from D/A converter 90 serves as a control signal for controlling an attenuation amount by modulator 10. It is to be noted that the signal outputted from power amplifier 40 is transmitted through antenna 1.

Furthermore, detection circuit 50 comprises: microstrip line 51a connected between power amplifier 40 and antenna 1; microstrip line 51b for constituting a directional coupler in company with microstrip line 51a; terminal resistor 52 connected between one terminal of microstrip line 51b and the ground terminal; detecting diode 53 having a cathode connected to a side of microstrip line 51b which is not grounded and an anode which is grounded; detection diode 54 having an anode connected to a side of microstrip line 51b which is not grounded and a cathode connected to a first inputting terminal of comparator 70; capacitor 55 connected between the cathode of diode 54 and the ground; resistors 56a and 56b, each having one terminal grounded and serving to determine the detection voltage; and change-over switch 57 connected between the first inputting terminal of comparator 70 and sides of resistors 56a and 56b which are not grounded, change-over switch 57 controlling a connection of resistors 56a and 56b and the first inputting terminal of comparator 70.

A transmission output control operation in the transmission section constructed as described above will be described individually for the case where a rated output is transmitted and for the case wherein a power-saving output is transmitted.

First, the transmission output control operation for the case where the rated output is transmitted will be described.

When a signal to be transmitted through antenna 1 is outputted from control section 7, modulator 10 modulates this signal so as to be transmitted through antenna 1 and outputs the modulated signal.

Subsequently, voltage control variable atternuator 20 attenuates the signal outputted from modulator 10 according to a predetermined attenuation amount, and outputs the attenuated signal. Hereupon, the attenuation amount of voltage control variable attenuator 20 is determined based on the control voltage outputted from D/A converter 90.

Next, driver amplifier 30 generates a signal to drive power amplifier 40 from the signal outputted from voltage control variable attenuator 20. In power amplifier 40, the signal outputted from voltage control variable attenuator 20 is amplified to a rated transmission output by the signal generated signal by driver amplifier 30 and outputted. The supply of a driving power source of driver amplifier 30 is controlled based on the power-saving control signal outputted from control section 7. When the rated output is transmitted, in other words, in a state where the power-saving control signal is not outputted from control section 7, the driving power source is supplied.

Thereafter, the signal outputted from power amplifier 40 is transmitted through antenna 1, and is demodulated by detection circuit 50, so that the detection voltage is detected.

In the detection circuit 50, microstrip line 51b which constitutes the directional coupler in company with microstrip line 51a detects the signal outputted from power amplifier 40, and the detected signal is converted to a DC current by diodes 53 and 54.

The signal converted to the DC current is inputted to one terminal of change-over switch 57. Hereupon, the switching operation of change-over switch 57 is controlled based on the power-saving control signal outputted from control section 7. When the rated output is transmitted, in other words, in a state where the power-saving control signal is not outputted from control section 7, the switching operation of change-over switch 57 is controlled so that resistor 56b and the cathode of diode 54 are connected, whereby the signal converted to the DC voltage comes to flow across resistor 56b. It is to be noted that as to the resistivities of resistors 56a and 56b, the resistivity of resistor 56a is set to be larger than that of resistor 56b and the detection voltage emerges at the first inputting terminal of comparator 70.

Figure 3:
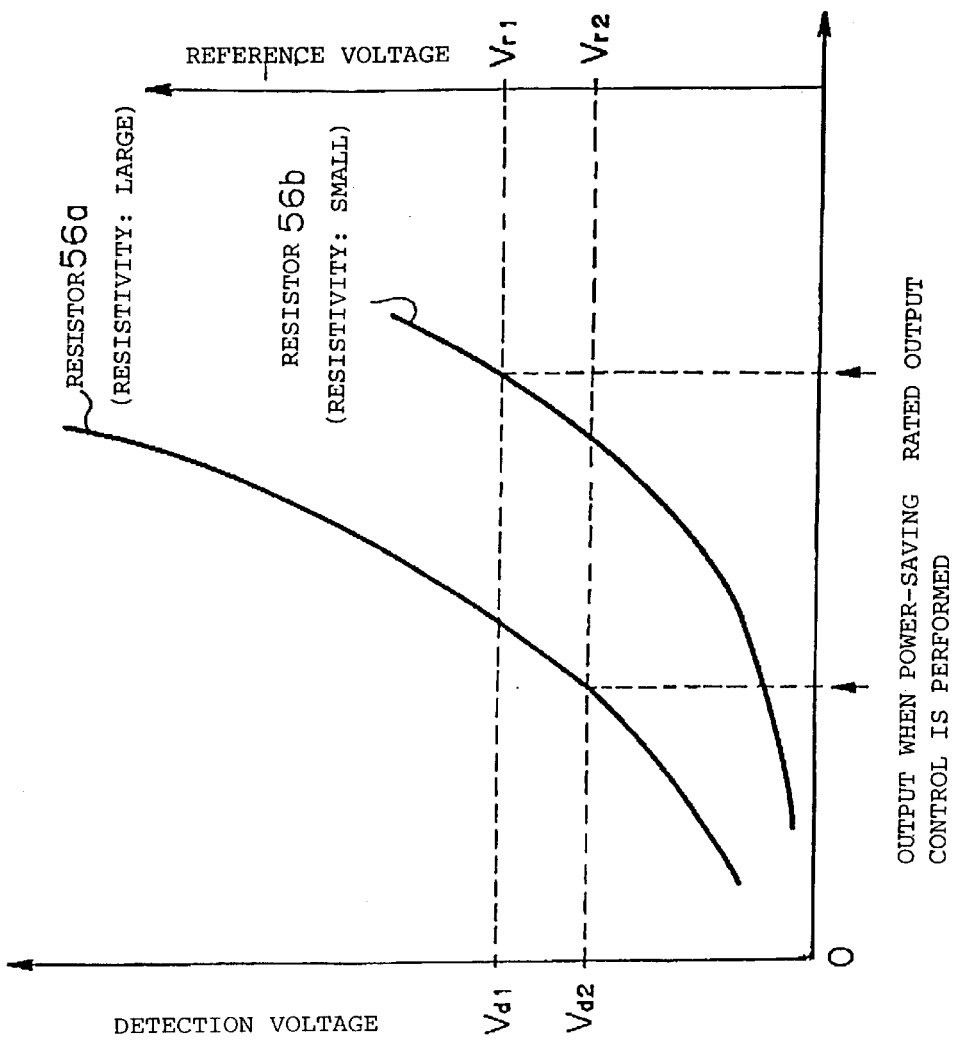
FIG. 3 is a graph showing a relation between a detection voltage and a resistor shown in FIG. 2.

FIG. 3 is a graph showing a relation between the detection voltage and resistors 56a and 56b shown in FIG. 2.

With reference to a characteristic of the detection voltage of detection circuit 50 against the load resistivity, as shown in FIG. 3, in general when the resistivity is large, the detection voltage becomes large, and when the resistivity is small, the resistivity becomes small.

Next, comparator 70 compares the detection voltage (Vd1 in FIG. 3) emerging at the first inputting terminal of comparator 70 with the reference voltage (Vr1 in FIG. 3) generated by reference voltage generating circuit 60, and outputs the comparison result. Hereupon, in reference voltage generating circuit 70, the reference voltage to be generated by reference voltage generating circuit 70 is controlled based on the power-saving control signal outputted from control section 7. When the rated output is transmitted, in other words, in a state where the power-saving control signal is not outputted from control section 7, the reference voltage for the rated output is generated.

Subsequently, up-down counter 80 performs a counting operation based on the comparison result outputted from comparator 70, and outputs a counted value. Hereupon, when the detection voltage emerged at the first inputting terminal of comparator 70 is higher than the reference voltage generated by reference voltage generating circuit 60, the transmitted output is considered to be higher than the rated value, and the counted value of up-down counter 80 is decremented by one bit.

Thereupon, D/A converter 90 converts the counted value outputted from up-down counter 80 to the analog signal and the DC current amounting to one bit decreases, and the analog signal is applied to voltage control variable attenuator 20 as the control voltage.

Then, voltage control variable attenuator 20 attenuates the signal outputted from modulator 10 depending on the attenuation amount which is determined based on the control voltage outputted from D/A converter 90, and outputs the attenuated signal.

Hereupon, when the device of an APC circuit composed of comparator 70, up-down counter 80, D/A converter 90 and the like is constituted by a device of a 3V system, the detection voltage appearing at the first inputting terminal of comparator 70 is generally designed and set to be 1 to 2 V near a center of the 3V system, by selecting degrees of coupling of microstrip lines 51a 51b, a resistivity of resister 56b and the like.

In this embodiment, the control operation in the foregoing APC circuit is repeated every transmission burst so that the detection voltage of the transmitted output becomes equal to the reference voltage generated by reference voltage generating circuit 60, whereby the transmitted output that is the rated output is stably outputted.

Next, the transmission output control operation for a case when power-saving control is performed will be described.

When a signal to be transmitted through antenna 1 is outputted from control section 7, modulator 10 modulates this signal so as to be transmitted through antenna 1 and outputs the modulated signal.

Subsequently, voltage control variable attenuator 20 attenuates the signal outputted from modulator 10 according to a predetermined attenuation amount, and outputs the attenuated signal. Hereupon, the attenuation amount of voltage control variable attenuator 20 is determined based on the control voltage outputted from D/A converter 90.

On the other hand, when power-saving control is performed, since the power-control signal is outputted from control section 7, the power source is not supplied to driver amplifier 30, so that driver amplifier 30 and power amplifier 40 are not driven, and the signal outputted from modulator 10 is directly outputted to detection circuit 50.

The signal outputted through power amplifier 40 is transmitted through antenna 1, and at the same time demodulated by detection circuit 50, followed by the detection of the detection voltage.

In detection circuit 50, microstrip line 51b which constitutes the directional coupler in company with microstrip line 51a detects the signal outputted from power amplifier 40, and the detected signal is converted to a DC current by diodes 53 and 54.

The signal converted to the DC current is inputted to one terminal of change-over switch 57. Hereupon, since the power-saving control signal is outputted from control section 7 to change-over switch 57, change-over switch 57 is controlled so that resistor 56b and the cathode of diode 54 are connected, whereby the signal converted to the DC voltage comes to flow across resistor 56a, and the detection voltage at the time of the power-saving control emerges at the first inputting terminal of comparator 70.

Next, comparator 70 compares the detection voltage (Vd2 in FIG. 3) emerging at the first inputting terminal of comparator 70 with the reference voltage (Vr2 in FIG. 3) generated by reference voltage generating circuit 60, and outputs the comparison result. Hereupon, when the power-saving control is performed, since the power-saving control signal is outputted from control section 7, the reference voltage generating circuit 60 generates the reference voltage for the power-saving control.

Next, up-down counter 80 performs a counting operation based on the comparison result outputted from comparator 70, and outputs the counted value.

Thereupon, D/A converter 90 converts the counted value outputted from up-down counter 80 to an analog signal, and the analog signal is applied to voltage control variable attenuator 20 as the control voltage.

Then, voltage control variable attenuator 20 attenuates the signal outputted from modulator 10 depending on the attenuation amount which is determined based on the control voltage outputted from D/A converter 90, and outputs the attenuated signal.

In this embodiment, the control operation in the foregoing APC circuit is repeated every transmission burst so that the detection voltage of the transmitted output becomes equal to the reference voltage generated by reference voltage generating circuit 60, whereby the constant transmitted output is stably outputted even when the power-saving control is being performed.

The dynamic range when power-saving control is performed can be enlarged up to about 20 to 40 dB.

(Another Embodiment)

Figure 4:
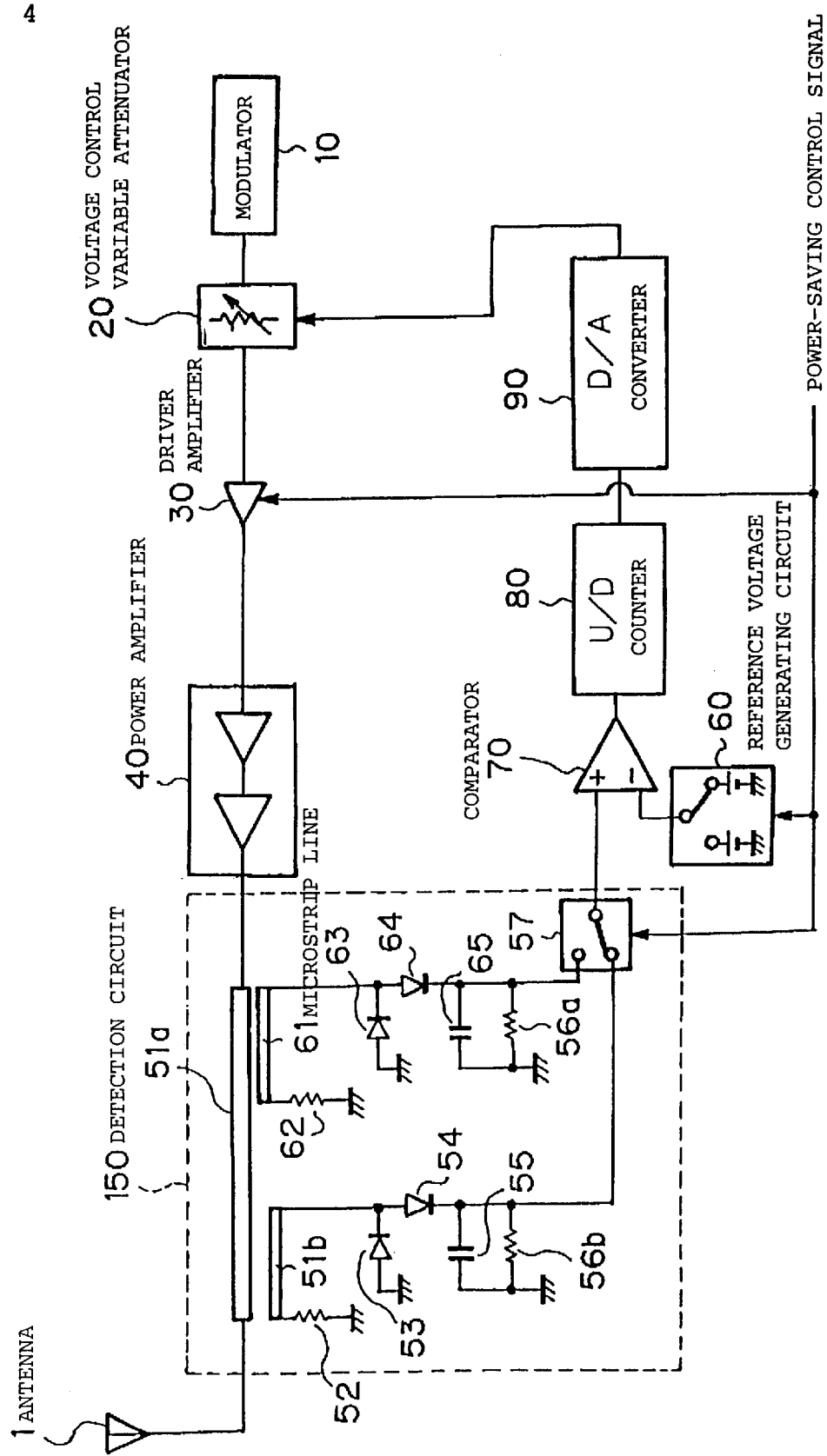
FIG. 4 is a block diagram showing another constitution example of the transmission section shown in FIG. 1.

FIG. 4 is a block diagram showing another constitution example of the transmission section shown in FIG. 1.

As shown in FIG. 4, this embodiment differs from that shown in FIG. 2 only in the constitution of the detection circuit. and other constitutions are the same as those of FIG. 2. This embodiment has a feature in that the directional coupler formed by the microstrip line is provided by two circuits in detection circuit 150.

In the transmission section shown in FIG. 4, when the rated output is transmitted, the detection circuit composed of the directional coupler constituted by microstrip lines 51a and 51b is used, and comparator 70 compares the detection voltage emerging at the cathode of diode 54 with the reference voltage generated by reference voltage generating circuit 60.

On the other hand, when power-saving control is performed, the detection circuit composed of the directional coupler constituted by microstrip lines 51a and 61 is used, and comparator 70 compares the detection voltage emerging at the cathode of diode 64 with the reference voltage generated by reference voltage generating circuit 60.

Hereupon, in this embodiment, the degree of coupling of the directional coupler constituted by microstrip lines 51a and 61 is set to be closer than that of the directional coupler constituted by microstrip lines 51a and 51b and the resistivity of load resistor 56a is set to be larger than that of resistor 56b, whereby the detection voltage emerging at the cathode of diode 64 becomes larger than that emerging at the cathode of diode 54.

As described above, in the radio telephone apparatus of the present invention, provided are modulation means for modulating a signal to be transmitted through an antenna; variable attenuating means for attenuating the signal modulated by the modulation means based on a control signal inputted thereto; amplifying means for amplifying the power of the signal attenuated by the variable attenuating means to output the amplified signal; detection means for demodulating the signal outputted from the amplifying means, thereby detecting a detection voltage; and comparing means for comparing the detection voltage detected by the detection means with a previously determined reference voltage, wherein the variable attenuating means takes a structure using a feedback loop which attenuates the signal modulated by the modulation means based on a comparison result from the comparing means, the amplifying means directly outputs the signal outputted from the variable attenuating means when a control signal is outputted from the control means and amplifies the power of the signal outputted from the variable attenuating means to output the amplifies signal when the control signal is not outputted from the control means, and the detection means switches the detection voltage depending on the presence of outputting of the control signal from the control means. Accordingly, the transmitted power is controlled so as to be different depending on the presence of the output of the control signal from the control means, and a constant transmitted output can be obtained stably even when the rated outputting is performed and even when the power-saving control is performed, thus enlarging a dynamic range at the time of power-saving control.

What is claimed is:

1. A transmitting apparatus having a power-saving control, said apparatus comprising:

a controller providing a power-saving control signal;

a modulator providing a modulated output signal to be transmitted;

an amplifier receiving said power-saving control signal and said modulator output signal, such that said modulated output signal to be transmitted is amplified if said power-saving control signal is in a first state and said modulated output signal to be transmitted is directly connected to an antenna conductor and not amplified if said power-saving control signal is in a second state; and a detector coupled to said antenna conductor, said detector having a switchable sensitivity and providing an input to control said controller.

2. A transmitting apparatus having a power-saving control, said apparatus comprising:

a controller providing a power-saving control signal;

a modulator providing a modulated output signal to be transmitted;

an amplifier receiving said power-saving control signal and said modulator output signal, such that said modulated output signal to be transmitted is amplified if said power-saving control signal is in a first state and said modulated output signal to be transmitted is directly connected to an antenna conductor and not amplified if said power-saving control signal is in a second state;

a voltage controlled variable attenuator, controlled by said power-saving control signal, and receiving said modulated output signal as an input signal and providing an attenuated output signal into said amplifier; and a reference voltage generator, controlled by said power-saving control signal, and providing an output signal to control said voltage controlled variable attenuator.

3. The apparatus of claim 2, further comprising:

a detector, controlled by said power-saving control signal, and providing an output detection voltage signal to control said voltage controlled variable attenuator.

4. The apparatus of claim 3, wherein said voltage controlled variable attenuator is controlled by said power-saving control signal by a control circuit, said control circuit comprising:

a digital-to-analog converter providing an analog signal to said voltage controlled variable attenuator;

a counter providing a digital signal to said digital-to-analog converter; and a comparator providing a signal to said counter and receiving a first input signal from said detector and a second input signal from said reference voltage generator.

5. The apparatus of claim 3, wherein said detector further comprises:

at least one coupler;

at least one detector diode; and a switch controlled by said power-saving control signal such that said detector is configured differently, based on said power-saving control signal.

6. A method of enlarging a dynamic range of a transmitting apparatus having a power-saving mode and including an attenuator outputting an attenuated modulated output signal to be transmitted and an amplifier receiving said attenuated output signal, said method comprising:

controlling said amplifier by a signal representing said power-saving mode such that said modulated output signal is amplified at a predetermined lower amplification if said power-saving mode is activated, and said modulated output signal is amplified at a predetermined higher amplification if said power-saving mode is not activated; and controlling said attenuator with a feedback loop that differs based upon whether said power-saving mode is activated, thereby enlarging said dynamic range.

7. The method of claim 6, wherein said feedback loop comprises a reference voltage generator and a detector, and at least one of said reference generator and said detector has different parameters based on whether said power-saving mode is activated.

8. The method of claim 7, wherein said reference voltage generator comprises:

a digital to analog converter to generate a voltage;
an up/down counter to provide an input into said digital to analog converter; and
a comparator to provide a direction signal into said up/down counter.

9. The method of claim 6, wherein a closed loop exists in said feedback loop to said attenuator during said power-saving mode.

10. The method of claim 8, wherein said power-saving mode changes a parameter in said reference voltage generator by switching a different voltage reference level as an input reference voltage of said comparator.

\* \* \* \* \*